United States Patent [19]

Nishizawa

[11] 4,115,793
[45] Sep. 19, 1978

[54] FIELD EFFECT TRANSISTOR WITH REDUCED SERIES RESISTANCE

[75] Inventor: Jun-ichi Nishizawa, Sendai, Japan

[73] Assignee: Zaidan Hojin Handotai Kenkyu Shinkokai, Sendai, Japan

[21] Appl. No.: 855,617

[22] Filed: Nov. 29, 1977

[30] Foreign Application Priority Data

Nov. 30, 1976 [JP] Japan .................. 51/143698

[51] Int. Cl.² ............... H01L 29/78; H01L 29/80
[52] U.S. Cl. .......................... 357/22; 357/23; 357/89
[58] Field of Search ............... 357/22, 23, 89

[56] References Cited

U.S. PATENT DOCUMENTS 3,430,113  2/1969  Roosild et al. .................. 357/22

Primary Examiner—Edward J. Wojciechowicz
Attorney, Agent, or Firm—Cushman, Darby & Cushman

[57] ABSTRACT

A field effect transistor having an additional highly doped source region contiguous to the source region and protruding into the channel having a shape approximately conforming to the shape of the depletion layer and almost contiguous with the depletion layer in a desired operative state, thereby reducing the series resistance from the source to the pinch-off point without increasing the capacitance between the source and the gate. The improvement is particularly effective for devices of a high power, high speed and high frequency use and is compatible with the integrated circuit techniques.

13 Claims, 36 Drawing Figures

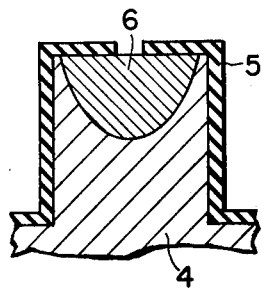
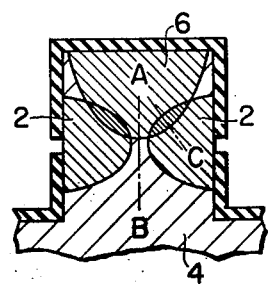
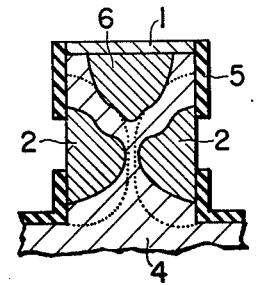
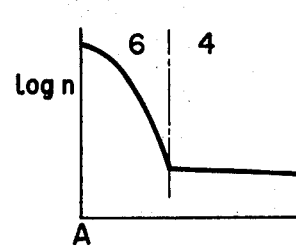
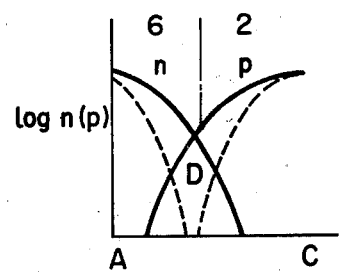
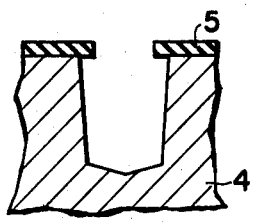
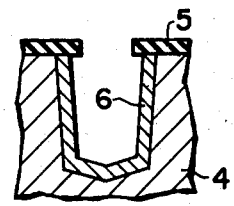
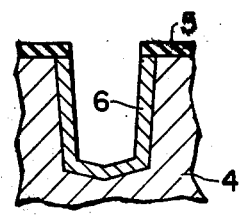
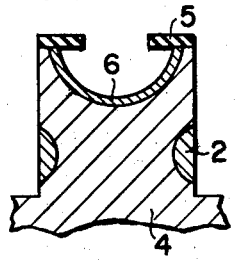
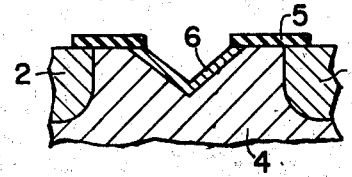
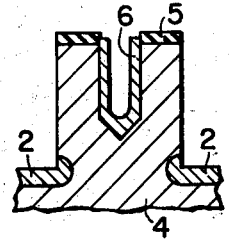
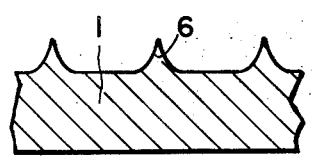
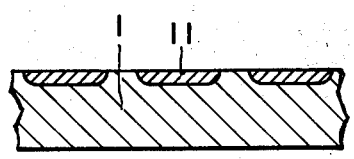
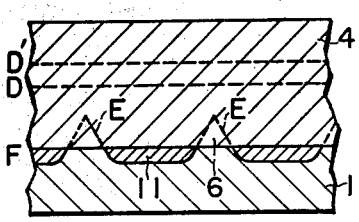

FIELD EFFECT TRANSISTOR WITH REDUCED SERIES RESISTANCE

BACKGROUND OF THE INVENTION (a) Field of the invention

The present invention relates to a field effect transistor, and more particularly it pertains to an improvement in the structure of a field effect transistor adapted for high power and high frequency use and for integrated circuit.

(b) Description of the prior art

Recent developments in field effect transistors have been directed to higher frequency use, higher operation speed, higher output and lower noise. At the present stage of technology, a maximum frequency of several tens giga-Hertz, a highest operation speed of subnanoseconds, a maximum output power of several tens watts in the giga-Hertz band and a minimum noise figure of several dB at several giga-Hertz band are available. All of these characteristics including frequency characteristic, output power, noise figure and so forth are under the influence of the (parasitic) capacitance between the source and the gate $C_{gs}$ (referred to hereinbelow as source-gate capacitance) and the series resistance $r_s$, and they will be improved by reducing the series resistance and/or the source-gate capacitance. Here, the series resistance $r_s$ is the resistance from the source to the intrinsic gate (or pinch-off point) in the channel.

Most of the conventional field effect transistors have a long and narrow channel which cannot be pinched off only by the gate bias voltage. In such structure, the series resistance $r_s$ is very large, and hence the drain current-to-voltage characteristic exhibits saturation, with the transconductance $g_m$ being limited by the resiprocal series resistance.

The present invention has proved that such saturating current-to-voltage characteristic is caused by the large series resistance from the source electrode to the intrinsic gate which further increases with the drain current, and has proposed a new type of field effect transistor having a reduced series resistance (of the above definition) and exhibiting unsaturating drain current-to-voltage characteristic (U.S. patent application Ser. No. 817052, IEEE Trans. Electron Devices Vol. ED-22, No. 4, p 185, 1975), which is called the static induction transistor (SIT).

In any type of the field effect transistor, the resistance from the source electrode to the entrance of the intrinsic gate (i.e. the resistance in the portion outside the active current-controlling portion) gives many adverse effects and is preferably reduced as small as possible. Reduction of the source-to-gate distance leads to an increase in the source-gate capacitance. Thus, the reduction of the series resistance $r_s$ and that of the source-gate capacitance are accepted usually as contradicting problems.

SUMMARY OF THE INVENTION

The present invention is intended to solve the above-mentioned disadvantages of the conventional field effect transistors.

An object of the present invention is to provide a field effect transistor having a small source-gate capacitance and a small series resistance from the source to the pinch-off point.

Another object of the present invention is to provide a field effect transistor having an improved frequency characteristic.

A further object of the present invention is to provide a field effect transistor having an improved output power characteristic.

Still another object of the present invention is to provide a field effect transistor having an improved noise characteristic.

According to an aspect of the present invention, there is provided a field effect transistor having a source, a drain and a gate and comprising an additional highly doped source region having a shape substantially conforming to the shape of the depletion layer and extending from the source toward the pinch-off point. Due to this additional highly doped source region, the source resistance of the neutral region from the source electrode to the pinch-off point can be reduced for a given source and gate structure. From the other point of view, the source-gate distance can be increased for a given source resistance.

These and other objects, features and advantages of the present invention will become apparent in the following detailed description of the preferred embodiments made in connection with the accompanying drawings.

BRIEF DESCRIPTION OF THE DRAWINGS

FIGS. 14a to 14c are schematic cross sections showing the manner in which an improved structure of the present invention is manufactured.

FIGS. 14d and 14e are schematic graphs showing impurity distribution profile in the structure of FIG. 14b.

FIGS. 15a to 15c are schematic cross sections showing the manner in which an improved structure of the present invention is manufactured.

FIGS. 16 to 18 are schematic cross sections showing the manner in which improved structures of the present invention are manufactured.

FIGS. 19, 20a and 20b are schematic cross sections showing the manner in which another improved structure of the present invention is manufactured.

DETAILED DESCRIPTION OF THE PREFERRED EMBODIMENTS

The present invention is an improvement of the structure of field effect transistors, and therefore, typical examples of the structure of conventional field effect transistors will be briefly described first. FIGS. 1a to 1j show typical structures of the conventional junction-type field effect transistors. Throughout the Figures, like parts are denoted by like numerals, and metal electrodes are not shown for the sumplicity of the presentation.

Figure 1A:
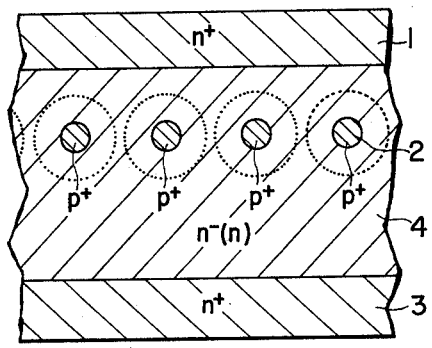
FIGS. 1a to 1j are schematic cross sections showing typical examples of the structure of a conventional field effect transistors.

In FIG. 1a, a field effect transistor includes an $n^+$ type source region 1, electrically connected $p^+$ type gate regions 2, an $n^+$ type drain region 3 and an $n^-$ or $n$ type channel region 4. The gate regions 2 are formed with parallel bars and embedded in the channel region 4. Interconnection of the respective gate regions may be achieved either within or outside of the channel 4. Dotted lines show the profile of the depletion layers growing around the respective gate regions when a certain (including zero) source-gate bias voltage is applied without the application of a drain voltage.

Figure 1D:
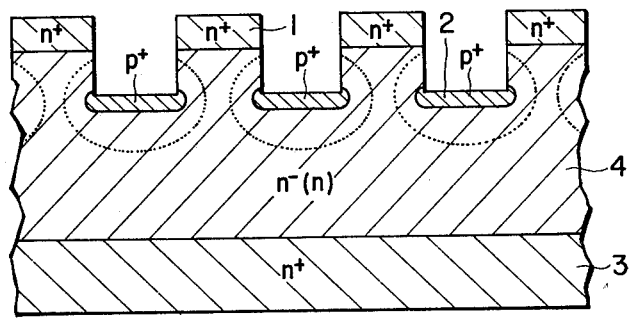
Figure 1B:
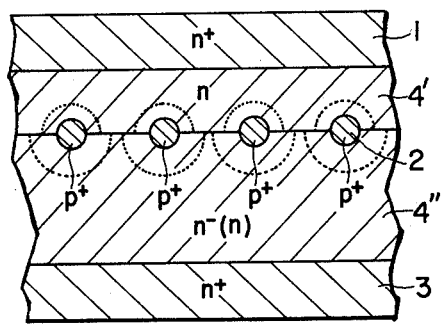

In FIG. 1b, the channel region is subdivided into an $n$ type source side channel region 4' and an $n^-$ or $n$ type drain side channel region 4'' in the structure of FIG. 1a. The impurity concentration of the source side channel region 4' is selected to be higher than that of the drain side channel region 4'' so that the width of the depletion layer in the region 4' is smaller than that in the region 4''. This is one way of reducing the series resistance from the source to the pinch-off point. However, when the impurity concentration of the region 4' is increased substantially for reducing the series resistance, the source-gate capacitance $C_{gs}$ will increase greatly with a decrease in the source-gate breakdown voltage.

Figure 1E:
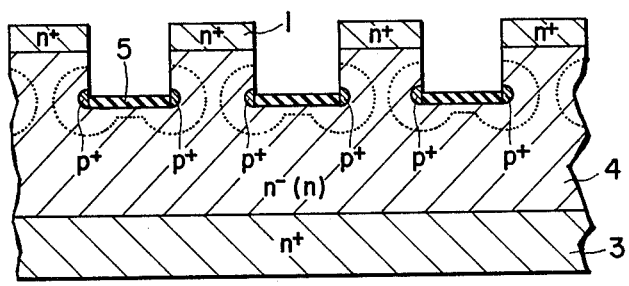
Figure 1C:
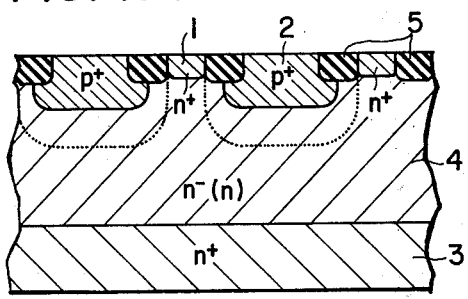

In FIG. 1c, the gate regions 2 are exposed on the surface. For the pinching-off of the channel, the source regions 1 and the gate regions 2 are disposed close to each other. Insulating regions 5 which are formed with silicon oxide and the like are disposed between the source and gate regions.

In FIG. 1d, the gate regions 2 are formed in the bottom of recessed portions. Namely, parallel grooves or recessed portions are formed to provide a grating-like structure and the source regions 1 and the gate regions 2 are formed in the top surfaces and the bottom surfaces. This structure provides similar advantages to those of the embedded gate of FIG. 1a, and yet it allows the formation of the gate after the source formation. Here, only the edge portions of the gate region 2 serves as the effective gate region, and the central portion of the gate region 2 contributes little to the controlling of the drain current but it serves to increase the source-gate capacitance.

FIG. 1e shows an improved modified structure of FIG. 1d, in which unnecessary portions of the gate regions are replaced by insulating layers 5 such as silicon oxide or the like.

Figure 1F:
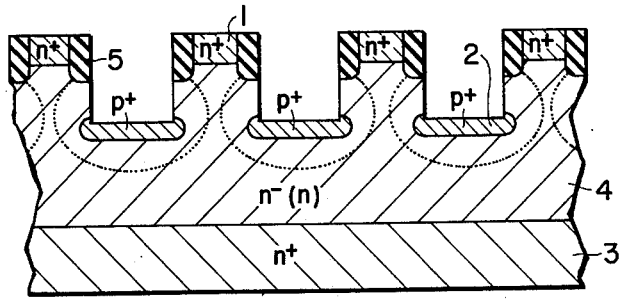

FIG. 1f is an alternative modification, in which the edge portions of the source regions 1 are replaced by insulating regions 5.

Figure 1G:
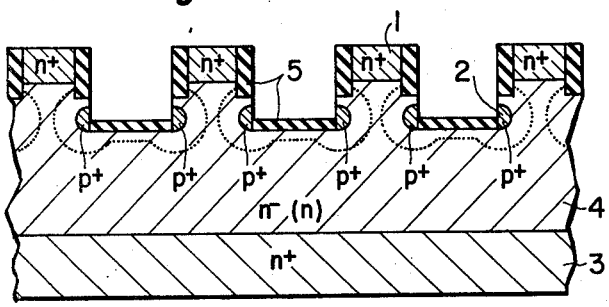

In FIG. 1g, unnecessary portions of both the source and the gate regions 1 and 2 are replaced by insulating regions 5 to minimize the source-gate capacitance $C_{gs}$.

Figure 1H:
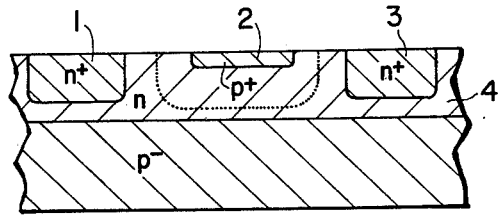

FIG. 1h shows a horizontal structure which may be the most popular structure of the field effect transistor. The $n$ type channel region is insulated from a $p^-$ type substrate 10 by the $pn$ junction. Alternatively, the substrate may be formed with an insulating or a semi-insulating material.

The above examples are shown to be $n$-channel devices. Apparently, there exist $p$-channel devices in which all the conductivity types are reversed. Also, all the illustrated gate structures are of the junction type, but there also exist MOS, MIS or Schottky type gates where possible. The gate structure of a field effect transistor is only required to have a rectifying property. The structures shown in FIGS. 1a to 1g are generally called the vertical field effect transistor and are adopted to provide a multiplicity of channels as shown in the Figures. Multi-channel structures are adapted to provide high output power operation. Among the vertical structures, FIGS. 1a and 1b show embedded gate structures, FIG. 1c shows a surface wiring gate structure, and FIGS. 1d to 1g show cut-away gate structures. These vertical structures are usually adopted when unsaturating current-to-voltage characteristic is desired. The horizontal structure of FIG. 1h is usually accompanied by a long and narrow channel which, in turn, provides saturating current-to-voltage characteristic.

Usually, the source, gate and drain regions 1, 2 and 3 have impurity concentrations of the order of $10^{17}$ to $10^{21}$ cm$^{-3}$, and the channel region 4 has an impurity concentration mostly ranging from $10^{12}$ to $10^{17}$ cm$^{-3}$, the value of which is selected according to the desired performance. For providing a field effect transistor of an unsaturating current-to-voltage characteristic, the impurity concentration of the channel and such dimensions as the gate-to-gate distance (half-channel width) are selected to achieve pinch-off of the channel by the depletion layer only by the gate bias voltage. For providing a field effect transistor of a saturating current-to-voltage characteristic, the impurity concentration and the dimensions are so selected that the channel is not pinched off only by the gate bias voltage, and can be pinched off only by the application of a drain voltage.

The depletion layer the profile of which is shown by the dotted line in the Figures contributes to form a source-gate capacitance $C_{gs}$. The dimensions and the arrangement of the source and the gate electrodes also contribute to the source-gate capacitance. The resistance of the neutral region from the source electrode to the pinch-off point (more precisely to the edge of the depletion layer when the channel is pinched off) contributes to the series resistance.

When the voltage amplification factor is $\mu$, the series resistance $r_s$ from the source electrode to the pinch-off point contributes to the source-to-drain resistance in the form of $(1 + \mu)r_s$. Here, the voltage amplification factor $\mu$ is usually much larger than 1 and shows not much variation by an increase in the drain current. Therefore, in the unsaturating characteristic, an increase in the series resistance $r_s$ will increase the source-to-drain resistance $r_d$ greatly to lower the output power, and also will lower the transconductance $g_m$ simultaneously as can be seen from the equation $\mu = g_m \cdot r_d$. In the saturating characteristic, the pinch-off drain voltage is mainly determined by the channel width and the impurity concentration in the channel, and is not much influenced by the series resistance. When the series resistance $r_s$ increases, the build-up gradient of the current-to-voltage characteristic in the low voltage region will become gentler. Thus, the current at the pinch-off drain voltage also becomes lower, i.e. the saturation current becomes lower. Hence, the output power will become smaller and the transconductance $g_m$ also will become smaller. Furthermore, a large series resistance $r_s$ will constitute a cause of thermal noises, and will deteriorate the noise characteristic of the field effect transistor.

The source-gate capacitance $C_{gs}$ is an important factor of restricting the upper limit of the operable frequency range, and gives a large influence of the total frequency characteristic of the field effect transistor. For example, the value $g_m/(2\pi C_{gs})$ approximately gives the upper limit (cut-off) frequency. Thus, the frequency response of a field effect transistor is improved as the transconductance $g_m$ becomes larger and also as the source-to-gate capacitance $C_{gs}$ becomes smaller. The source-gate capacitance $C_{gs}$ is mainly determined by the width and the shape of the depletion layer and the dimensions and relative position of the source and the gate electrodes. Needless to say, the source-gate capacitance $C_{gs}$ becomes smaller as the width of the depletion layer becomes larger and as the source-to-gate distance becomes longer.

Recalling the fact that the series resistance $r_s$ is determined by the distribution of impurity concentration and by the dimension (length, shape, etc) of the channel region from the source to the pinch-off point, the series resistance $r_s$ will become smaller as the impurity concentration becomes higher and as the distance from the source to the pinch-off point becomes shorter.

Therefore, the reduction of the series resistance and the reduction of the source-to-gate capacitance usually give a contradicting problem.

The structure shown in FIG. 1b enables a reduction in the series resistance $r_s$, but it increases the source-gate capacitance. Furthermore, it has the disadvantage that the source-gate breakdown voltage cannot be made large.

The structures shown in FIGS. 1a, 1d to 1h have the disadvantage that the distance from the source to the pinch-off point is too long to raise the series resistance $r_s$.

The structure of FIG. 1c has an advantage that the series resistance can be reduced but with the accompaniment of the disadvantages that the pinch-off of the channel becomes difficult, that particular care is required for the insulation between the source and the gate, that the source-to-gate breakdown voltage becomes low and that the manufacture requires a higher precision.

Figure 1I:
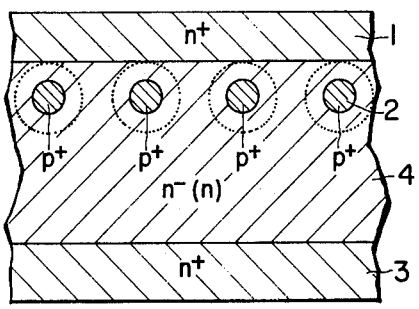
Figure 1J:
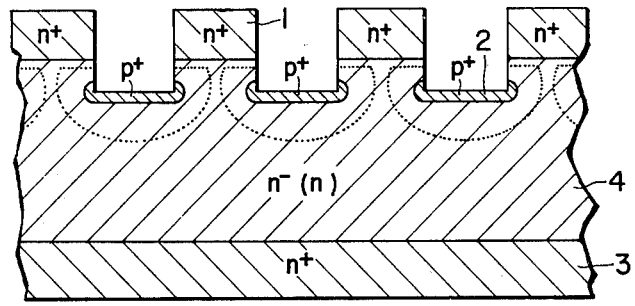

When a reduction in the series resistance is intended to be made in the structures as shown in FIGS. 1a and 1d, such structures as shown in FIGS. 1i and 1h may be adopted. In these structures, however, a reduction in the source-to-gate distance which reduces the series resistance results in an increase in the source-gate capacitance $C_{gs}$. Thus, the short source-to-gate structure of FIGS. 1i and 1j cannot improve the frequency characteristic decisively.

The present invention enables a reduction in the sereis resistance $r_s$ without increasing the source-gate capacitance $C_{gs}$, or may enable a reduction in the source-gate capacitance $C_{gs}$, without increasing the series resistance. The following description will be made on n-channel junction-type field effect transistors having a reduced series resistance for the purpose of simplicity, but the present invention is equally applicable to other types field effect transistors.

A decrease in the series resistance $r_s$ can be achieved by increasing the impurity concentration in the neutral region from the source toward the pinch-off point. A higher impurity concentration enables sufficient carrier supply to the drain side region and decreases the resistance in the neutral region. Here, if the shape of the depletion layer is preserved as it is, the source-gate capacitance $C_{gs}$ will not increase. This can be achieved by highly doping only the converging neutral regions (corresponding to the effective current path) confined by the depletion layer. In any practical structure, the depletion layer cannot grow perfectly in parallel with the interface of the source region and the channel region. Thus, there remains a converging neutral region around or between the depletion layers. The resistance of this converging region occupies a considerable part of the series resistance since the source region is highly doped to have only a small resistance, because the channel region is relatively lightly doped to effectively control the drain current by the gate voltage and because the resistance will naturally increase with a decrease in the cross section of the current path. The width of the depletion layer varies with the gate bias voltage. Thus, a neutral region from the source to the pinch-off point under the gate bias voltages in the desired operative state may be highly doped to achieve the above purpose. In some cases, doping may be done to leave no neutral and/or lightly doped region from the source to the pinch-off point. Furthermore, the doping level may be gradually increased from the foot of the converging portion up to the top thereof.

Figure 2:
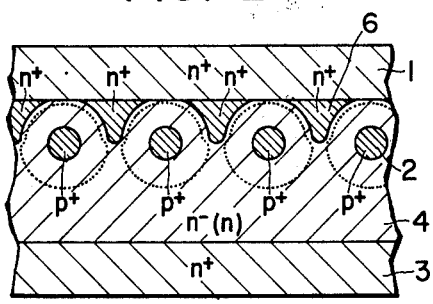
FIGS. 2 to 7 are schematic cross sections showing normal vertical structures of the field effect transistor according to the embodiments of the present invention where the drain is formed on the substrate side.
Figure 5:
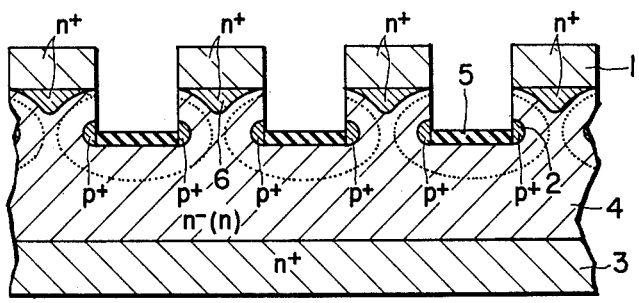

FIG. 2 shows an embedded gate type field effect transistor corresponding to the structure of FIG. 1a.

Figure 3:
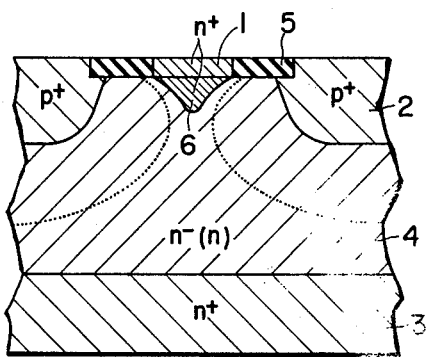
Figure 6:
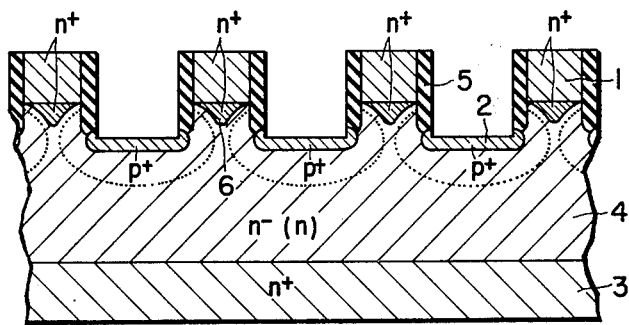

FIG. 3 shows a structure with coplanar source and gate corresponding to the structure of FIG. 1c.

Similarly, FIGS. 4 to 7 show recessed gate or grating-type structures corresponding to the structures of FIGS. 1d to 1g.

Figure 8:
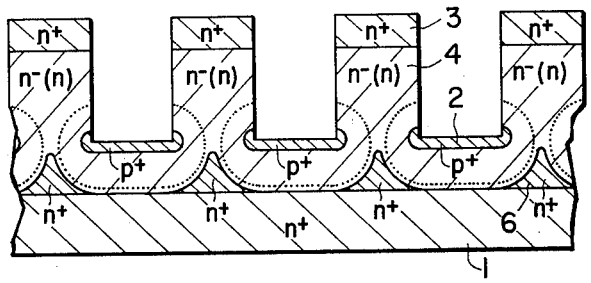
FIGS. 8 to 11 are schematic cross sections showing inverted vertical type structures of the field effect transistor according to the embodiments of the present invention wherein the source is formed on the substrate side.
Figure 9:
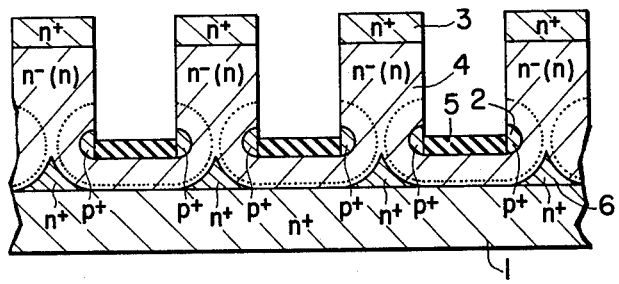

FIGS. 8 and 9 show structures resembling those of FIGS. 1d and 1e, but the source and the drain are reversed, being arranged upside down.

Figure 10:
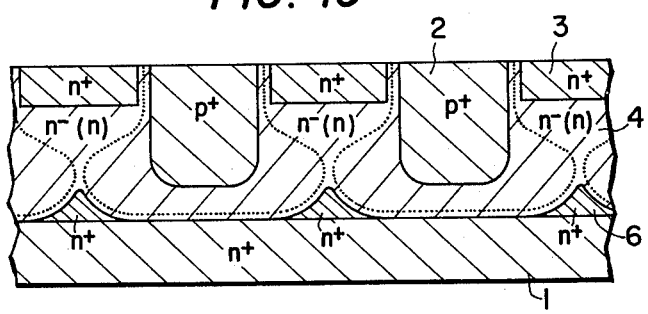
Figure 11:
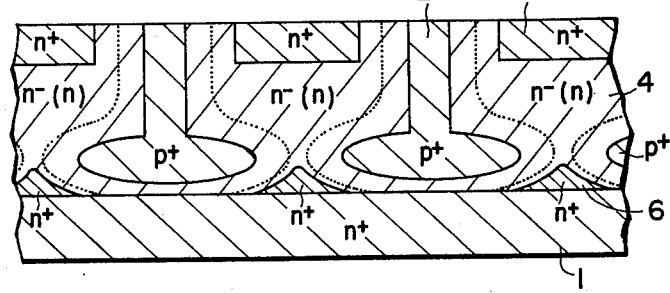

FIGS. 10 and 11 also show structures of inversely operated type field effect transistor adapted for use in integrated circuits. FIG. 10 shows a simple form, and FIG. 11 shows a modified gate shape for increasing the current control efficiency.

Figure 12:
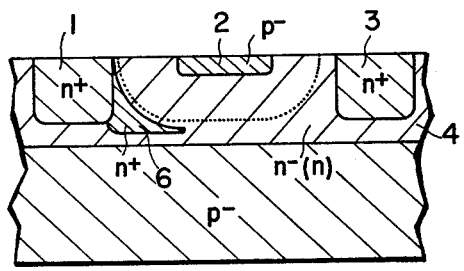
FIG. 12 is a cross section showing a horizontal type structure of the field effect transistor according to an embodiment of the present invention.

FIG. 12 shows a horizontal type structure and corresponds to that of FIG. 1h.

Figure 4:
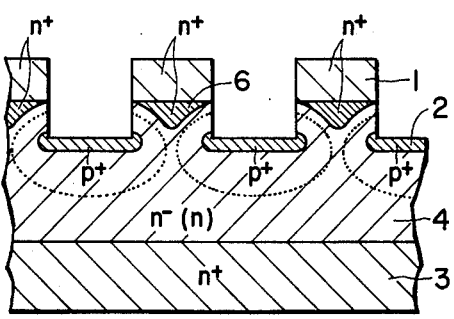
Figure 7:
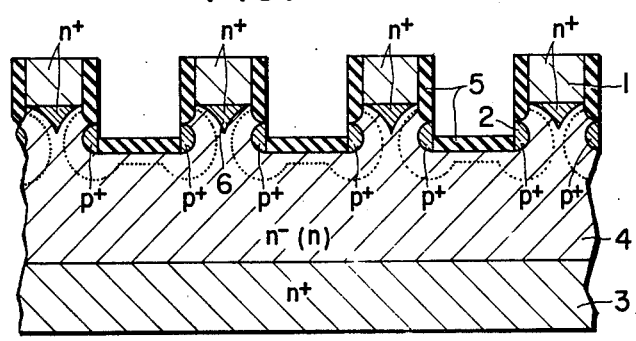
Figure 13:
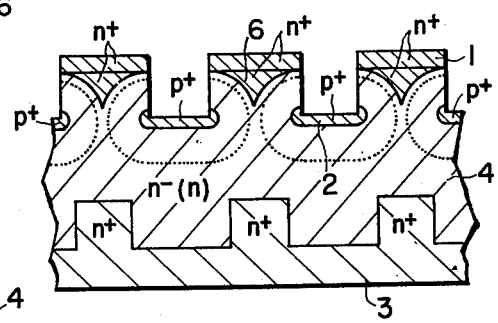
FIG. 13 is a cross section showing a vertical type structure of the field effect transistor according to a further embodiment of the present invention.

FIG. 13 shows a further embodiment of the structure resembling that of FIG. 4, but an improvement is also provided in the drain side. Such improvement can equally be applicable to other structures.

In FIGS. 2 to 13, there is provided an additional highly doped region 6 contiguous to the source region and convergingly extending from the source to a point near the pinch-off point. The impurity concentration of this additional highly doped region may vary according to such factors as the desired use, the impurity concentration of the channel region, the distance to the pinch-off point and the shape of this additional region, and is of the order of $10^{15}$ to $10^{21}$ cm$^{-3}$. For a low frequency use or when a higher value of maximum reverse voltage is desired, the impurity concentration of this additional region 6 may be selected relatively low, i.e. of the order of $10^{15}$ to $10^{17}$ cm$^{-3}$. For a high frequency and large output power use, the impurity concentration of the region 6 is higher the better. The additional source region 6 is preferably designed to be contiguous with the depletion layer in the desired operative state.

For the simplicity of the presentation, metal electrodes to the source, the gate and the drain regions 1, 2 and 3 are not shown. In some cases, gate regions may be formed of very highly doped regions of boron to dispense with the gate wiring above the device portions, and a metal electrode may be deposited on an extracted gate region. Apparently, all the conductivity types may be inverted to form p-channel devices. Also, the plan structure of the gate may also be of a mesh type as well as the parallel stripes type. The gate structure is only required to effectively control the charge carriers transported from the source to the drain by the depletion layer extending from the gate into the channel.

Further description will be made on the drain modification shown in FIG. 13. In FIG. 13, the $n^+$ type drain region 3 partially protrudes into the channel region 4 at the positions registered with the current channels. In other words, the drain region 3 is recessed away in the portions facing against the gate region 2 to increase the effective gate-to-drain distance. This modification is effective for reducing the gate-drain capacitance $C_{gs}$ and/or for reducing the transit time of the carriers in the channel region, particularly when the channel region 4 of a relatively low impurity concentration becomes mostly depleted.

When the transistor is a static induction transistor proposed by the present inventor, the voltage amplification factor $\mu$ can be approximately represented by the distance from the center of the channel to the top of the protruding drain region divided by the distance from the center of the channel to the bottom edge of the additional $n^+$ type source region 6. Therefore, the voltage amplification factor $\mu$ can be increased, and the carrier transit time from the source to the drain can be reduced, and the capacitances between the source and the gate $C_{gs}$ and between the gate and the drain $C_{gd}$ can be reduced, thereby improving the high frequency performance.

Throughout the above embodiments, the additional highly doped region 6 having a converging cross section from the source to the channel is not necessarily conform perfectly to the shape of the depletion layer, but it provides a remarkable effect if it approximately conforms to the shape of the depletion layer and is substantially contiguous to the depletion layer in the desired operative state. In other words, the additional source region is preferably designed to keep the width of the depletion layer almost unchanged from the extent which would be achieved without this additional source region and yet leaving no neutral region between this additional source region and the depletion layer. It will be apparent that device parameters can be appropriately selected according to the intended use.

Also the gate structure is apparently not limited to the junction-type, but it may be any one having the rectifying property. For example, the junction gate of FIGS. 3 to 9 and 12 may be readily substituted by a MOS gate, a MIS gate or a Schottkey gate.

Furthermore, it will be seen that the present invention is very advantageous in a high speed integrated circuit. As has been described above, the field effect transistor of the present invention provides a small sereis resistance, a high transconductance and a small source-gate capacitance. In the case of a digital logic IC, the small series resistance enables a rapid buildup operation from the "off" state to the "on" state. The larger transconductance $g_m$ enables a large output current by a small input signal, which leads to a quick charge-up of the following stage. Furthermore, the small source-gate capacitance enables a further quick change of the gate voltage (i.e. charging of the capacitor) for a fixed current supply. The discharge of the gate capacitor can also be achieved quickly through the small series resistance in the preceding stage. Thus, the operation of an IC can be enhanced remarkably.

Next, description will be made with respect to the manufacture of the field effect transistor according to the present invention. The field effect transistor according to the present invention is compatible with all the conventional manufacturing techniques. Thus, description will be made only with respect to the formation of the additional highly doped source region 6 on the source side. First, description will be made on the formation of a simplified structure having a cylindrical channel region, with a source and a drain region provided in the upper and the lower ends, and a ring-like gate region formed in the side surface at an intermediate position of the cylinder.

Referring to FIG. 14a, an $n^-$ type cylindrical channel region 4 is prepared, and a mask 5 having an aperture in the top end surface is formed thereon. An $n$ type impurity is doped deeply into the channel region 4 through the aperture to form an $n^+$ type region 6. Then, the mask is removed, and another mask having a ring-like aperture on the side surface of the cylinder is formed as shown in FIG. 14b. A $p$ type region 2 is formed by deeply diffusing a $p$ type impurity through the aperture on the side surface of the cylinder. Here, the method proposed in Japanese patent application No. 51-114131 may be employed. The diffusion of a $p$ type impurity is also achieved deeply so as to have part of the diffused $p$ type region 2 overlap with part of the previously diffused $n$ type region 6. If necessary, another highly doped $n^+$ type source region may be formed in the top surface of the cylinder. Alternatively, the highly doped $n^+$ type region 6 may be used directly as an ohmic-contact-forming highly doped source region. In such case, the source-gate capacitance $C_{gs}$ can be suppressed smaller. Distributions of the impurity concentration along lines AB and AC are shown in FIGS. 14d and 14e, in which the abscissa represents position and the ordinate represents the impurity concentration in logarithmic scale. Along the line AC, the effective carrier density in the overlapping portion D becomes low due to compensation of $n$ type and $p$ type impurities. Furthermore, since the edge portion of the diffused region has a low impurity concentration, the width of the depletion layer due to the pn-junction becomes wider. Thus, a depletion layer as shown in FIG. 14c will be formed. It is effective to employ impurities having a large diffusion constant and/or to raise the diffusion temperature to raise the diffusion constant. Namely, when the diffusion constant is large, the gradient of the diffused impurity concentration becomes gentler and the region of a relatively low impurity concentration at the edge of the diffused region becomes wider. Thus, the compensated region will become wider, and the regions forming the pn-junction will have low impurity concentrations, and hence the pn-junction will have a small junction capacitance. Needless to say, the gate region may be formed prior to the formation of the source region.

FIGS. 15a to 15c schematically show another method of forming the field effect transistor according to the present invention. A mask 5 of an insulating film such as silicon oxide or silicon nitride is formed on a channel region 4. Then, selective etching is performed by relying on the sputter-like plasma etching technique to form a recess in the channel region 4 at the position of the source region which is to be formed. The position of the bottom of the recess is adjusted not to be below the level of the gate region, and the width of the recess is selected to be narrower than the channel. Then, an $n$ type impurity is selectively diffused (FIG. 15b) or an $n$ type layer is selectively grown (FIG. 15c) to form an $n^+$ type highly doped region 6. This method requires no deep diffusion as in that of FIGS. 15a to 15c. Appropriate selection of the etchant and the crystal orientation in this method enables the formation of such structures as shown in FIGS. 16 to 18. FIG. 16 shows an example wherein a hemispherical recess is formed by a relative isotropic etching, such as HF—HNO$_3$ series etching or plasma etching with CF$_4$, and the like. Combination of the isotropic etching with the compensating diffusion by the p type impurity of the gate region is very effective. FIG. 17 shows the case wherein the crystal has a (100) surface, and etching is performed in an aqueous solution of KOH or NaOH. In this case, the etched portion has a cone-like shape with approximately the same length of the side etch as the depth of etching. FIG. 18 shows the case wherein the crystal has a surface slanted by a certain angle from a (110) surface. In this etching method, the $n^+$ type highly doped region 6 may be formed also by the diffusion or by the growth after the removal of the mask 5 followed by the removal of unnecessary portions, as well as the selective diffusion or growth before the removal of the mask. Even when the removal of the mask precedes the formation of the highly doped $n^+$ type region 6, there is needed no additional step for the formation of such structures as shown in FIGS. 2, and 4 to 7. Namely, no removal is required in the case of FIG. 2, and removal of unnecessary portions can be performed simultaneously with the formation of recesses in the cases of FIGS. 4 to 7.

Furthermore, the formation of the highly doped $n^+$ type region 6 may also be performed by ion implantation. A wide variety of structures can be formed by appropriately varying the accelerating voltage for ions during scanning or by disposing an appropriate buffer layer of oxide and the like having varying thicknesses on the crystal surface.

The highly doped $n^+$ type region 6 protruding from the substrate as in FIGS. 8 to 11 can be formed in the manner as follows.

For example, protrusions 6 are formed in the surface of the $n^+$ type substrate by relying on the selective etching technique as is shown in FIG. 19, and an $n^-$ type channel region 4 is grown thereon.

Alternatively, a p type impurity is selectively doped in the surface of the $n^+$ type substrate 1 to form p type doped regions 11 as shown in FIG. 20a. Here, the impurity concentration in the p type region 11 is selected to be lower than that in the $n^+$ type substrate. Then a lightly doped $n^-$ type layer is epitaxially grown thereon. Both the p type and the n type impurities redistributes into the grown layer 4 by the diffusion and by an auto-doping during the epitaxial growth. Here, the n type impurity re-distributes in the region between line D and the interface F partially through the p type region 11. The p type impurity re-distributes in the region between line D' and the interface F. Here, it is to be noted that the p type region does not cover the whole surface of the substrate 1. Therefore, the p type impurity does not re-distributes much into the regions 6 defined by the line E and the interface F. In the main region below the line D, the n type and p type impurities compensate for each other, but the n type impurity dominates in the regions 6. As the result, $n^+$ type highly doped regions 6 protruding into the channel are thus formed. The positions of lines D and D' are determined by the kinds of the impurity atoms, and the positions thereof shown in FIG. 20b are only an example. Alternatively, further highly doped $n^+$ type regions may be formed on the substrate surface to achieve a similar effect or combinations of the above methods can be employed. It will be apparent that p-channel devices may be formed by the same method, with the inversion of all the conductivity types.

As has been described above, the field effect transistor according to the present invention including a highly doped additional source region extending and converging from the source into the channel in conformity with the envelope of the depletion layer can much decrease the series resistance from the source to the pinch-off point without increasing the capacitance between the source and the gate. Therefore, the frequency characteristic, the output power and the noise characteristic can be improved, and the operation speed in the logic operation can also be improved. Furthermore, since the width of the depletion layer shows almost no change by the gate bias voltage due to the contact of the depletion layer with the additional source region, there appears no non-linear capacitance between the source and the gate in operation to provide excellent characteristics. Yet further, there exists no high frequency loss due to the residual neutral region in the lightly doped $n^-$ type channel region near the source. Thereby, the response to the input signal and the frequency characteristic of the field effect transistor becomes remarkably improved. Furthermore, since the distance between the pinch-off point at which the drain current of the field effect transistor is controlled, and the source-side highly doped region is shortened, the transit time of carriers travelling therebetween is much shortened. Due to this effect, the frequency characteristic is improved further. Thus, the present invention improves the frequency characteristic, the high operation speed, the output power and the noise characteristic. Therefore, the present invention promises high and large utility in industry.

What is claimed is:

1. A field effect transistor comprising:
   a semiconductor region of one conductivity type;
   a highly doped source region of said one conductivity type disposed adjacent to said semiconductor region;
   a gate structure disposed adjacent to said semiconductor region to define at least one channel in said semiconductor region by depletion layer extending therefrom;
   at least one highly doped drain region of said one conductivity type disposed adjacent to said semiconductor region; and
   an additional highly doped source region disposed adjacent to said source region in said semiconductor region and extending toward the channel with a converging envelope conforming to the envelope of the depletion layer.

2. A field effect transistor according to claim 1, wherein: said additional highly doped source region is disposed remote from said gate structure.

3. A field effect transistor according to claim 1, wherein: said additional highly doped source region is substantially contiguous with the depletion layer at least in the desired operative state.

4. A field effect transistor according to claim 3, wherein: said depletion layer extends to said additional highly doped source region to leave substantially no neutral region in said semiconductor region between the source and a pinch-off point in the desired operative state.

5. A field effect transistor according to claim 1, wherein: said channel has a low impurity concentration.

6. A field effect transistor according to claim 1, wherein: said gate structure defines a multiplicity of channels and said additional source region is provided for each said channel.

7. A field effect transistor according to claim 1, further comprising: an additional highly doped drain region disposed in said semiconductor region adjacent to said drain region.

8. A field effect transistor according to claim 7, wherein: said depletion layer extends to said additional highly doped source and drain regions to leave substantially no neutral region in said semiconductor region.

9. A field effect transistor according to claim 1, wherein: said gate structure includes a semiconductor gate region of the other conductivity type opposite to said one conductivity type.

10. A field effect transistor according to claim 9, wherein: said semiconductor region of said one conductivity type contains impurities of both said one and said the other conductivity types in a region adjacent to said semiconductor gate region.

11. A field effect transistor according to claim 1, wherein: the series resistance from the source to the pinch-off point is suppressed, thereby the field effect transistor exhibits unsaturating drain current-to-voltage characteristic in the desired operative state of this field effect transistor.

12. An integrated circuit structure including at least one field effect transistor, said field effect transistor comprising:
   a semiconductor region of one conductivity type;
   a highly doped source region of said one conductivity type disposed adjacent to said semiconductor region;
   a gate structure disposed adjacent to said semiconductor region to define at least one channel in said semiconductor region by depletion layer extending therefrom;
   at least one highly doped drain region of said one conductivity type disposed adjacent to said semiconductor region; and
   an additional highly doped source region disposed adjacent to said source region in said semiconductor region and extending toward the channel with a converging envelope conforming to the envelope of the depletion layer.

13. An integrated circuit according to claim 12, wherein: the number of said field effect transistors is at least two, the drain region of one of said field effect transistors is connected to the gate structure of the other one of said field effect transistors.

* * * * *